United States Patent [19]

Graham et al.

[11] Patent Number: 4,573,146
[45] Date of Patent: Feb. 25, 1986

[54] TESTING AND EVALUATION OF A SEMICONDUCTOR MEMORY CONTAINING REDUNDANT MEMORY ELEMENTS

[75] Inventors: Andrew C. Graham, Dallas; Robert J. Proebsting, Plano; Dennis L. Segers, Lewisville, all of Tex.

[73] Assignee: Mostek Corporation, Carrollton, Tex.

[21] Appl. No.: 370,171

[22] Filed: Apr. 20, 1982

[51] Int. Cl.[4] .................. G11C 8/00; G11C 11/40
[52] U.S. Cl. ............................. 365/200; 365/201
[58] Field of Search .................. 365/200, 201, 210; 371/10, 11, 21

[56] References Cited

U.S. PATENT DOCUMENTS

| | | | |
|---|---|---|---|
| 4,051,354 | 9/1977 | Choate | 365/200 |
| 4,346,459 | 8/1982 | Sud et al. | 365/200 |
| 4,399,372 | 8/1983 | Tanimoto et al. | 365/200 X |

*Primary Examiner*—Joseph A. Popek

[57] ABSTRACT

A method and apparatus is described for initiating a selected functional mode for a semiconductor memory circuit to determine the implementation of redundant elements in a semiconductor memory. The method for initiating the selected functional mode comprises applying an active state of at least a first of the operational signals to the memory circuit followed by applying an active state of a second of the operational signals to the memory circuit. The timing of the second operational signal relative to the first operational signal is not within the defined specification limits of the first and the second operational signals for conventional data transfer to and from the memory. An example of the selected functional mode is the activation of circuitry (62) which serves to apply a predetermined data state to a redundant column (63) which can be substituted to replace a defective primary column within a memory array. After the memory array has previously received a first data state and the circuit (62) is activated to apply a second data state to the redundant column (63) the memory array is read and each column which produces a second data state is determined to be a redundant column. With knowledge of the column substitution algorithm, it can then be determined which of the redundant columns have been programmed to replace specific original columns. This method can therefore determine the physical configuration of the memory circuit despite the incorporation of redundant elements into the primary memory array.

9 Claims, 5 Drawing Figures

TESTING AND EVALUATION OF A SEMICONDUCTOR MEMORY CONTAINING REDUNDANT MEMORY ELEMENTS

TECHNICAL FIELD

The present invention pertains to semiconductor memory circuits and in particular to the application of redundancy in such circuits.

BACKGROUND ART

As semiconductor memory technology progresses there is an increasing need for on-chip testing, examination and evaluation. It has conventionally been the practice to functionally test a memory circuit by conducting various combinations of the usual read and write operations. However, this is becoming increasingly difficult. As the capacity of memory circuits becomes larger, the time required to test the circuits increases. For certain types of tests, such as for pattern sensitivities, the number of testing steps can be proportional to the square of the number of memory elements. Thus, comprehensive testing for large random access memories can become excessively time consuming.

A further feature which must be considered in testing is that of redundancy. The use of redundant circuit elements to replace defective circuit elements has been adopted to increase the yield of usable devices. Certain users of semiconductor memories are especially interested in pattern sensitivities in the testing of these parts. With a fixed physical layout, without redundancy, a fixed testing procedure can be carried out for each type of part. However, with the advent of redundancy the user has not been able to know for certain the physical layout of the operational elements within the memory. Without this knowledge the user may be reluctant to accept a part which may have had a redundant element substituted into the primary memory array.

The functional operation of the circuit with redundancy is essentially the same as that of one without redundancy. Therefore, the user, by conventional functional testing, cannot determine whether redundant elements have been implemented into the circuit.

On-chip testing or examination has been proposed to reduce the testing requirements for memory circuits. However, there are serious limitations in attempting to do this. The conventional packaging for dynamic random access memories is a 16-pin package for which standard definitions have been made for each of the pins. Therefore, there are virtually no pins available for receiving additional commands to carry out on-chip testing. Further, the use of excessive voltage states on certain pins to command special functions is a hazardous practice since it is possible to damage the circuit in doing so.

The data sheets for semiconductor memories have limiting specifications that define the timing for each of the command signals applied to the memory circuit. The user of the circuit must comply with these specifications to insure proper operation of the circuit. In addition, the designer of the circuit must insure that the circuit responds only to the design specifications such that the user can be confident that the part will function in the manner he desires.

From the above it can be seen that there is a substantial need to provide a determination of the implementation of redundant elements but there are severe restrictions placed upon the transmission of command signals to the memory circuit. Thus, there exists a need for a method and apparatus for determining when and which redundant elements have been activated in a semiconductor memory circuit without adding to the pin count for the part, avoiding the use of excessive voltage states and without altering the well accepted data sheet specifications.

SUMMARY OF THE INVENTION

A preferred embodiment of the present invention comprises a method for evaluating a semiconductor memory fabricated with redundant elements, the semiconductor memory including a memory array having a plurality of memory elements selectable by an address signal wherein the memory array may have one or more of the redundant memory elements implemented therein. The method includes the steps of providing a selected functional command to the semiconductor memory and driving the redundant elements to a selected voltage state in response to the command and independent of the address signal provided through the semiconductor memory.

BRIEF DESCRIPTION OF THE DRAWINGS

For a more complete understanding of the present invention and the advantages thereof, reference is now made to the following Description taken in conjunction with the accompanying Drawings in which.

DETAILED INVENTION

In current applications the most widely used semiconductor memory is the dynamic random access memory type. This is due to its high density and relatively low manufacturing cost. An example of such a memory is the MK 4116 manufactured by Mostek Corporation. This type of memory utilizes a multiplexed address made up of a row address segment and a column address segment. These address signals are strobed into the memory by command signals known as row address strobe (RAS) and column address strobe (CAS). The read or write function for the memory circuit is controlled by an operational signal defined as WRITE.

Figure 1:
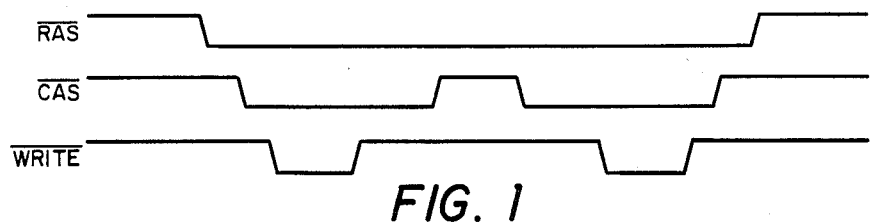
FIG. 1 is a timing diagram for operational signals provided to a semiconductor memory for illustrating the data sheet limitations imposed upon these signals.

The definitions for the above operational signals have been widely accepted in the industry. Further, the relative timing of these signals has been substantially standardized and incorporated into the data sheets for each of the memory circuits. The conventional timing limitations for these signals are illustrated in FIG. 1. Although the operational signals RAS, CAS and WRITE are properly defined with the inverse bar sign, the operational signals herein will be referred to without the bar designation for convenience.

Further referring to FIG. 1 it can be seen that a CAS cycle is defined to occur within a single RAS cycle. The low level of the signal is the active state. There may be a plurality of CAS cycles within a RAS cycle. It is further defined that there can be only one WRITE cycle within a single CAS cycle. Thus, a legal WRITE cycle can occur only with a concurrent CAS cycle and RAS cycle. Thus, the user of a semiconductor memory cannot provide a plurality of WRITE cycles within a single CAS cycle while complying with the defined standards.

The structure of a conventional dynamic random access memory having a row and column configuration and the function of the RAS, CAS and WRITE signals for such a memory is described in U.S. Pat. No. 3,969,706, issued July 13, 1976 to Robert J. Proebsting et al., which patent is herein incorporated by reference.

Figure 2:
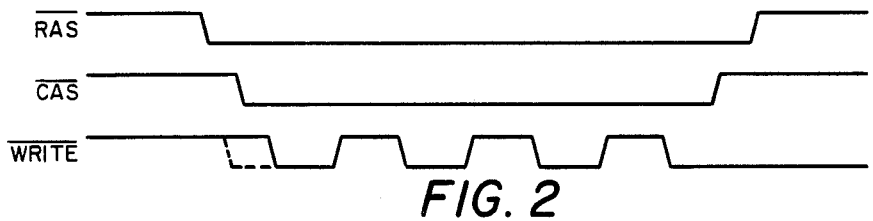
FIG. 2 is an illustration of timing signals showing the implementation of a method for applying commands to a semiconductor memory circuit to activate a selected functional mode other than data transfer for the memory circuit.

Referring now to FIG. 2 there is illustrated a timing sequence for providing a functional command to a semiconductor memory circuit. For the present application the accepted standards for RAS and CAS signals remain unchanged including the primary limitation that a CAS cycle can occur only within a RAS cycle. However, the utilization of the WRITE command signal is changed. In conventional data transfer operations there is only one WRITE cycle, or low state pulse, allowed within a single CAS cycle. But, for the present application a plurality of WRITE pulses are applied within a single CAS cycle with the second and subsequent pulses initiating selected functional modes for the semiconductor memory. The accepted standard defines a WRITE cycle as being initiated by the later of CAS and WRITE going low. The WRITE signal timing as indicated by the dashed line in FIG. 2 is entirely compatible with the described method.

The primary application for such selected functional modes is now believed to be testing and evaluating semiconductor memories. However, there is the possibility that such selected modes could be utilized in an operational environment.

The use of a plurality of WRITE pulses within a single CAS cycle, as shown in FIG. 2, is not a logical operation for data transfer since there would be no purpose served by writing more than once at a single address within one memory cycle. Further such operation, as described above, is not permitted under the definition for the WRITE signal in the specification sheets for existing memory circuits.

Figure 3:
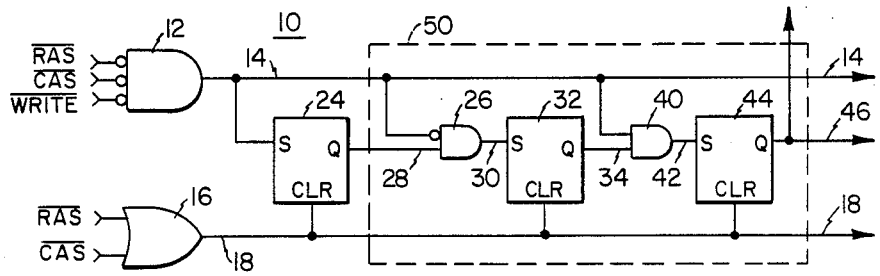
FIG. 3 is a schematic illustration of a circuit for carrying out the method for initiating a selected functional mode for a memory circuit.

A circuit for recognizing the plurality of WRITE pulses is illustrated in FIG. 3. A sequence detector circuit 10 is fabricated as an integral part of the semiconductor memory circuit as described in the referenced patent. The circuit 10 is connected to receive the operational signals RAS, CAS and WRITE as shown in FIG. 1. In response to the receipt of a second WRITE pulse, within a RAS and CAS cycle, an output is generated to activate selected functional circuitry to carry out a predefined test or evaluation for the memory circuit. Further referring to FIG. 3 the operational signals RAS, CAS and WRITE are each transmitted through inverters to an AND gate 12. The output of gate 12 is transmitted through a line 14.

The RAS and CAS signals are further provided to an OR gate 16 which transmits the output thereof to a line 18.

The output of gate 12 is connected to the set input of a flip-flop 24. The output of gate 16 is connected through line 18 to the clear input of flip-flop 24.

Line 14 is connected through an inverter to a first input of an AND gate 26. The Q output of flip-flop 24 is transmitted through a line 28 to the second input of AND gate 26. The output of AND gate 26 is transmitted through a line 30 to the set input of a flip-flop 32. Line 18 is connected to the clear input of flip-flop 32. The Q output of flip-flop 32 is transmitted through a line 34.

Line 14 is further connected to the first input of an AND gate 40 and line 34 is connected to the second input thereof. The output of gate 40 is transmitted through a line 42 to the set input of a flip-flop 44. Line 18 is further connected to the clear input of flip-flop 44. The output of flip-flop 44 is taken at the Q terminal thereof and transmitted through a line 46.

Figure 4:
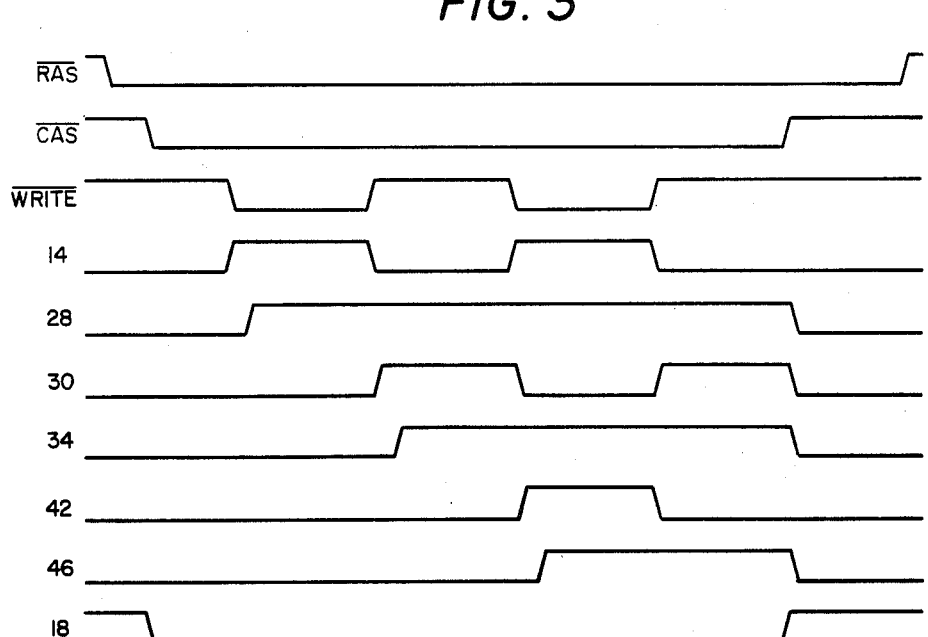
FIG. 4 is an illustration of signal waveforms which occur in the circuit shown in FIG. 3.

Waveforms which occur at various lines in FIG. 3 are illustrated in FIG. 4.

Operation of the sequence detector circuit 10 is now described in reference to FIGS. 3 and 4. Line 14 goes to a high voltage state only when all of the operational signals RAS, CAS and WRITE are concurrently in the low, active, state. When this occurs the flip-flop 24 is set and its Q output goes to a high state as shown for line 28. Line 30 stays at a low voltage state as long as line 14 is high.

When the WRITE signal transitions to the high state indicating the end of the first WRITE pulse, line 14 goes to a low state which causes the output of AND gate 26 at line 30 to go to a high state. This in turn sets flip-flop 32 such that its Q output at line 34 goes high. The output of AND gate 40 at line 42 remains low since line 14 remains low.

When the WRITE signal enters its second active pulse, transitioning from high to low, the AND gate 40 receives two high inputs therefore driving its output at line 42 to a high state. The high state at line 42 is provided to the set input of flip-flop 44 which drives the Q output at line 46 to a high state. Line 46 is connected to activate circuitry for implementing the selected functional mode for the integrated circuit memory. Flip-flop 44 is latched such that the WRITE pulse can terminate but the state of flip-flop 44 will not change. This is shown by the WRITE signal making its final transition from the low to the high voltage state without a change in the state of the signal at line 46.

For the described circuit the active WRITE pulse must occur concurrently with the RAS and CAS cycles. If either RAS or CAS terminates, the sequence detector circuit 10 is reset since circuit 10 is designed to detect only the second active WRITE pulse. This reset is carried out by operation of OR gate 16. If either of the signals RAS or CAS goes to a high state, line 18 will likewise be driven to a high state and reset all of the flip-flops 24, 32 and 44 as shown. This drives the Q output for each of these flip-flops to the low voltage state. Thus; circuit 10 serves to detect only the second active WRITE pulse when it is received within both an active RAS and an active CAS cycle.

The resetting of the circuit 10 is illustrated by the signal at line 18 going from a low to a high voltage state.

The circuit 10 can be expanded to respond to any one of a series of WRITE pulses within a RAS and a CAS cycle. This is accomplished by replicating the components within the dashed line 50 with the three left hand input lines 14, 28 and 18 connected respectively to the output lines 14, 46 and 18. Each of the additional circuits corresponding to that within dashed line 50 detects a later WRITE pulse. Each of these later pulses can be utilized to initiate a separate functional mode for the memory circuit which includes circuit 10. The first mode would be signaled by node 46 being high and the corresponding node of the next dashed circuit being low. Similarly, the second functional mode would be selected by the second node being high and the third low. Thus, there can be a substantial number of added functional modes which can be selected for the memory circuit.

Figure 5:
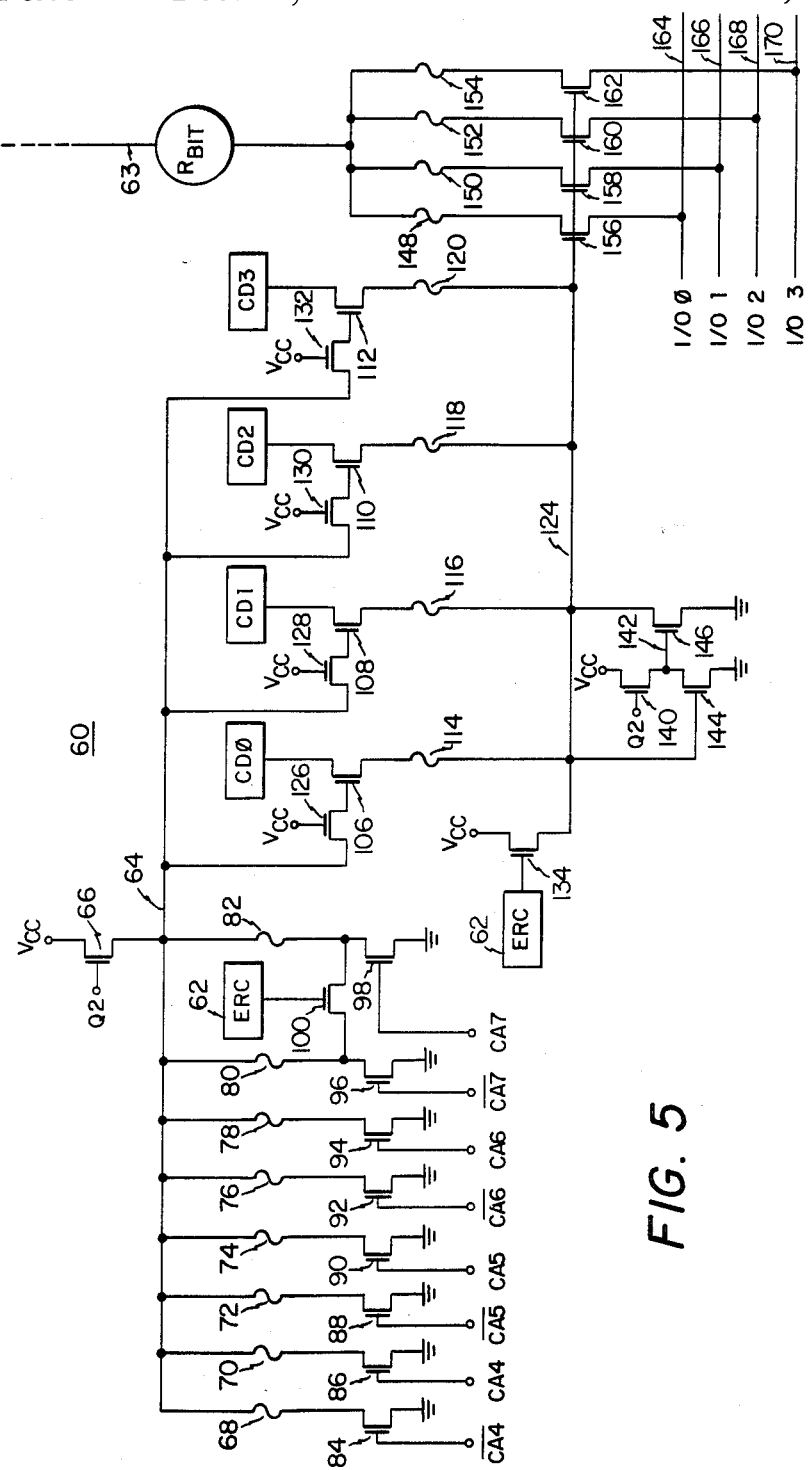
FIG. 5 is a schematic illustration of a redundant address decoder which utilizes the method of the present invention to provide a roll call to determine the implementation of redundant circuit elements in a semiconductor memory circuit.

A specific application of the circuit 10 for the present invention is illustrated in FIG. 5. A redundant decoder circuit 60 utilizes the sequence detector circuit 10 in the form of an enable roll call (ERC) circuit. The ERC circuit is designated by the numeral 62. The output of circuit 62 corresponds to the selected mode signal at line 46 shown in FIG. 3. Thus, the output of circuit 62 is generated in the method described above when a second active WRITE pulse is received within an active RAS and CAS cycle.

The circuit 60 is utilized within a semiconductor memory circuit which includes one or more redundant elements. The described embodiment is utilized in a memory circuit which has rows and columns. The circuit 60 is used with each of a plurality of redundant columns. The redundant columns are substituted to replace defective columns within the primary memory array. The decoder circuit 60 is programmed to recognize the address for the defective column to permit the redundant column to serve as the functional substitute for the primary column which has been found to be defective. The programming of a redundant column to replace a defective column is herein termed "implementing."

The structure of the decoder circuit 60 and its relation to the present invention is now described in reference to FIG. 5. Circuit 60 is used in conjunction with a redundant column 63 which has the structure and function of a column as described in the above-noted U.S. Pat. No. 3,969,706 which is incorporated herein. Note that a column is also referred to as a bit line.

Circuit 60 includes a node 64 which is precharged to a high voltage state by operation of a transistor 66. The drain and source terminals of transistor 66 are connected between a power voltage source $V_{cc}$ and node 64. The gate terminal of transistor 66 is connected to receive a precharge signal designated as Q2.

A plurality of fusible links 68-82 each have a terminal connected to the node 64. A plurality of transistors 84-98 have the drain terminals thereof connected respectively to the remaining terminals of the fusible links 68-82. Each of the transistors 84-98 has the source terminal thereof connected to ground. The gate terminals of transistor 86, 90, 94 and 98 respectively receive the true state of column address (CA) signals 4, 5, 6 and 7. The gate terminals of transistor 84, 88, 92 and 96 respectively receive the complement of the column address signals 4, 5, 6 and 7.

The ERC circuit 62 is connected to the gate terminal of a transistor 100 which has the drain and source terminals thereof connected between the drain terminals of transistors 96 and 98. Thus, when the ERC circuit 62 provides a high voltage state to transistor 100 the drain terminals of transistors 96 and 98 are connected together.

A plurality of column decode (CD) signals are provided to the decoder circuit 60. These are designated as CD0, CD1, CD2 and CD3. These are signals which are produced from decoded address signals. The signals CD0, CD1, CD2 and CD3 are provided respectively to the drain terminals of transistors 106, 108, 110 and 112. A group of fusible links 114, 116, 118 and 120 are connected respectively between the source terminals of transistors 106, 108, 110 and 112 and a node 124.

A group of transistors 126, 128, 130 and 132 have the drain and source terminals thereof connected respectively between node 64 and the gate terminals of transistors 106, 108, 110 and 112. The gate terminals for each of the transistors 126, 128, 130 and 132 is connected to the positive power supply $V_{cc}$.

The ERC circuit 62 is further connected to the gate terminal of a transistor 134 which has the drain terminal thereof connected to $V_{cc}$ and a source terminal thereof connected to node 124. When circuit 62 produces a high output voltage, transistor 134 is rendered conductive to pull node 124 to a high voltage state.

A transistor 140 has the gate terminal thereof connected to receive the precharge signal Q2, the drain terminal thereof connected to the power terminal $V_{cc}$ and the source terminal thereof connected to a node 142. A transistor 144 has the drain terminal thereof connected to node 142, the gate terminal thereof connected to node 124 and the source terminal thereof grounded. A transistor 146 has the drain terminal thereof connected to node 124, the gate terminal thereof connected to node 142 and the source terminal thereof grounded. The transistors 140, 144 and 146 serve as a quiet line flip-flop circuit to maintain node 124 at a low voltage state until it is pulled above a predetermined threshold voltage.

The redundant column 63 is connected to each of a group of fusible links 148, 150, 152 and 154. Node 124 is connected to the gate terminals of transistors 156, 158, 160 and 162. The drain terminals of transistors 156, 158, 160 and 162 are connected respectively to the fusible links 148, 150, 152 and 154. The source terminals of transistors 156, 158, 160 and 162 are connected respectively to input/output lines 164, 166, 168 and 170.

The decoder circuit 60 is programmed by means of the fusible links to replace a defective column in the primary memory array of a memory circuit. Once a defective column has been located, four of the eight fusible links 68-82 and three of the four lines 114-120 are selectively opened, preferably by a laser, so that node 64 responds to the address provided to the defective column and so that the same CD phase utilized by the defective column is connected to node 124 whenever node 64 is high. In the embodiment described for the present invention there are utilized four input/output lines 164, 166, 168 and 170. However, there need only be at least one input/output line. For the described embodiment the redundant column 63 must be connected to the appropriate input/output line. This is carried out by opening three out of the fusible links 148, 150, 152 and 154 such that the column line 63 is connected through the nonopen link to the appropriate input/output line.

Prior to each CAS cycle, node 64 is pulled to a high voltage state by operation of the precharge transistor 66. If the decoder circuit 60 is selected by the address provided to the memory circuit, node 64 remains at a high voltage state, but otherwise one of the transistors 84-98 will be activated to pull node 64 to a low voltage state. If node 64 remains at a high voltage state the transistors 106, 108, 110 and 112 will be maintained in the conductive state awaiting receipt of one of the column decode signals CDØ-CD3. These are derived from a portion of the column address provided to the memory circuit. Only one of these four column decode signals will be activated in response to a given address. The links 114–120 are programmed, selectively opened, as a part of the selection of the address for memory decoder circuit 60.

Node 124 is maintained at a low voltage state by the precharge signal Q2 and the operation of the quiet line flip-flop transistors 140, 144 and 146. But if the decoder circuit 60 is selected, one of the column decode signals 0–3 will be propagated through the corresponding transistor to pull node 124 to a high voltage state by overpowering and then turning off the quiet-line flip-flop. This high voltage state will render conductive each of the transistors 156, 158, 160 and 162. This in turn serves to connect the redundant column 63 to the appropriate one of the input/output lines 164, 166, 168 and 170. Thus, after the decoder circuit 60 is properly programmed it will respond to the address provided to the defective column such that data can be written into and read from the memory circuit by the user without regard to the implementation of a redundant circuit element.

As noted above certain users may wish to know the physical configuration of the memory circuit in addition to the electrical characteristics. The user wishes to know which defective columns have been deleted from the primary array and which redundant columns have been substituted for given defective columns. This information can serve a useful purpose in reducing the time required to run pattern sensitivity tests. The readout of redundant and nonredundant memory elements is herein termed "roll call".

The ERC circuit 62 functions to apply a known voltage, data state, to the redundant column 63. This predetermined voltage state can then be stored in the capacitors of the memory cells connected to the redundant column. When the ERC circuit 62 is activated, transistor 134 is rendered conductive to pull node 124 to a high state. This renders transistors 156, 158, 160 and 162 conductive thereby guaranteeing that the redundant column 63 is connected to at least one of the input/output lines 164, 166, 168 and 170. The user can then transmit a desired voltage state through the input/output lines to the redundant column 63. Thus, the user can provide either a high or a low voltage state to the redundant column 63 for storage in the memory cells connected thereto.

The transistor 100 is rendered conductive to assure that node 64 is pulled to a low voltage state by operation of either transistor 96 or 98. This turns off transistors 106–112 to prevent any interference with the operation of node 124. Thus, when circuit 62 is activated, any desired voltage state can be applied to the redundant column 63. This operation similarly occurs for each of the redundant columns in the memory circuit.

The method of the present invention for determining the existence and location of redundant memory elements in the overall memory circuit is carried out generally as follows. The redundant memory elements can be row lines or column lines. The entire memory array, which may or may not include programmed redundant elements, is written to a first data state, such as 0. Next, the redundant elements are written to a second data state as described above by use of the ERC circuit. The second data state can be a 1. The array is then read element by element and each element that indicates a 1 data state is therefore determined to be a redundant element. By knowing in advance the algorithm used by the manufacturer for substituting redundant element for defective primary elements, the user can then determine the physical location of the redundant elements.

In a preferred embodiment the memory elements, both primary and redundant, are columns. One memory cell is written and read for each column.

A more detailed description of a method of the present invention is described as follows. A selected row address is provided to the memory circuit and the column addresses are sequenced across the entire memory. While doing this a data state 0 is written into each of the memory cells which are addressed. One memory cell is written per column. Next, a given column address is selected with the same row address as selected above and the selected functional mode is implemented by applying two active write pulses as described above. The first write pulse carries out the normal write function and writes a data state 1 for the selected address. The second active write pulse activates the enable roll call circuit 62 which causes a data state 1 to be written for each of the redundant column lines, regardless of whether the redundant column decoder has been programmed to respond to a specific column address.

In the next step, a read operation, the same row address is maintained and the column address is sequenced across the array. Except for the address which was utilized to write to the redundant columns, each addressed memory cell which reads a 1 corresponds to a redundant column. All addresses which read a 0 correspond to original columns. Thus, the status for all but the addressed column has been determined. In order to make the determination for this final column the whole array is again written with a data state 0 or only the previously addressed column is written. A different column is selected for writing a data state 1 in each of the redundant columns, also by use of the two active write pulses. Finally the originally addressed column, which was utilized to write to the redundant columns, is again read. If the memory cell for this column now contains a 1, this column was likewise a redundant column but if it reads out a 0 state it is determined to be an original column. Thus, a complete determination of the original or redundant status for the columns for the entire memory array has been made.

The method of the present invention can be utilized to evaluate the effect on adjacent columns caused by the charging of a redundant column, whether or not the redundant column has been implemented in the memory array. Sensitivity tests can thus be run for memory circuits utilizing redundancy without being dependent upon the particular implementation of the redundancy. The method can further be utilized, as described above, to determine which of the original memory elements have been replaced in the memory array by redundant memory elements.

In summary, the present invention comprises a method for evaluating a semiconductor memory circuit containing redundant elements. Redundant elements are programmed to replace defective elements in the primary memory array. A selected functional command is provided to the semiconductor memory to connect the redundant elements to the I/O lines. Next, a selected voltage state is transmitted through the I/O lines to the redundant memory elements. A further method of the present invention comprises determining the implementation of redundancy in a semiconductor memory. In a first step a first data state is written to each of the memory elements in the primary array. In the next step a second data state is written into each of the redundant elements regardless of whether the redundant element has been programmed to replace a defective element. Finally the elements of the memory array are read and each element which has the second data state stored therein is determined to be one of the redundant elements which has been implemented to replace the defective element. This is then repeated for the memory element which was addressed to write the second data state.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

We claim:

1. A method for evaluating a semiconductor memory fabricated with redundant elements, said semiconductor memory including a memory array having a plurality of memory elements selectable by an address signal wherein the memory array may have one or more of the redundant memory elements implemented therein, the method comprising the steps of:
providing a selected functional command mode to said semiconductor memory; and
driving said redundant elements to a selected voltage state in response to said command and independent of said address signal.

2. A method for evaluating a semiconductor memory fabricated with redundant elements, the semiconductor memory having a memory array having a plurality of memory elements which are connectable to transfer data through an input/output line in response to an address signal wherein the memory array may have one or more implemented redundant memory elements therein leaving the rest, if any, of the redundant memory elements as non-implemented redundant memory elements, the method comprising the steps of:
receiving a selected functional mode command provided to said semiconductor memory;
connecting said implemented and non-implemented redundant memory elements to said input/output line in response to said command; and
transmitting a selected voltage state through said input/output line to said implemented and non-implemented redundant memory elements.

3. A method for determining the implementation of redundant column lines in a semiconductor memory which has a memory array having a plurality of column lines wherein the memory array may have redundant column lines incorporated therein, the method comprising the steps of:
writing a first data state into a plurality of memory cells connected respectively to the column lines of said memory array;
writing a second data state to a memory cell connected to a first addressed one of the column lines of said memory array and writing said second data state to a plurality of memory cells connected respectively to said redundant column lines;
reading the ones of said memory cells connected to the column lines of said memory array to determine that the column lines, other than said addressed column line, connected to memory cells which have said second state stored therein are ones of said redundant column lines;
writing said first data state to a memory cell connected to a second addressed one of said column lines;
writing said second data state to said plurality of memory cells connected respectively to said redundant column lines; and
reading the memory cell connected to said second addressed column line to determine that said second addressed column line is one of said redundant column lines if said memory cell connected to said second addressed column line has said second data state stored therein.

4. A circuit for writing selected data states to redundant memory elements in a semiconductor memory circuit which has a memory array having a plurality of memory elements which transfer data through an input/output line wherein the memory array may have redundant memory elements incorporated therein, said memory circuit having primary address decoders for selecting said memory elements in said memory array and redundant address decoders for selecting the redundant memory elements, the circuit comprising:
means for receiving a selected functional mode command signal; and
means responsive to said command signal for connecting said redundant memory elements to said input/output line for data transfer therethrough.

5. The circuit recited in claim 4 wherein said means for connecting includes means responsive to said command signal for disabling said redundant address decoders.

6. The circuit recited in claim 4 including means responsive to said command signal for disabling said primary address decoders.

7. A circuit for writing selected data states to redundant column lines in a semiconductor memory circuit which has a memory array having a plurality of column lines which are connectable to transfer data through an input/output line wherein the memory array may have redundant column lines incorporated therein, said memory circuit having primary address decoders for selecting said column lines in said memory array and redundant address decoders for the redundant column lines, the circuit comprising:
means for receiving a selected functional mode command signal; and
means responsive to said command signal for connecting said redundant column lines to said input/output lines for data transfer therethrough.

8. The circuit recited in claim 7 wherein said means for connecting includes means responsive to said command signal for disabling said redundant address decoders.

9. The circuit recited in claim 7 including means responsive to said command signal for disabling said primary address decoders.

* * * * *